(12) United States Patent
Fukuda et al.

(10) Patent No.: US 8,614,505 B2
(45) Date of Patent: Dec. 24, 2013

(54) SEMICONDUCTOR DEVICE WITH HEAT SPREADER

(75) Inventors: Tomoyuki Fukuda, Aizuwakamatsu (JP); Yoshihiro Kubota, Yokohama (JP); Hiroshi Ohtsubo, Yokohama (JP); Yuichi Asano, Aizuwakamatsu (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/596,708

(22) Filed: Aug. 28, 2012

(65) Prior Publication Data

US 2012/0319264 A1 Dec. 20, 2012

Related U.S. Application Data

(62) Division of application No. 13/023,962, filed on Feb. 9, 2011, now Pat. No. 8,278,743.

(30) Foreign Application Priority Data

Jun. 28, 2010 (JP) ................................. 2010-145908

(51) Int. Cl.
*H01L 23/34* (2006.01)
(52) U.S. Cl.
USPC .......................................... 257/712; 257/713
(58) Field of Classification Search
USPC ................................................. 257/712, 713
See application file for complete search history.

(56) References Cited

U.S. PATENT DOCUMENTS

| | | | |
|---|---|---|---|
| 6,716,676 B2 | 4/2004 | Chen et al. | |
| 6,919,631 B1 | 7/2005 | Hoffman et al. | |
| 7,126,218 B1 | 10/2006 | Darveaux et al. | |
| 7,432,586 B2 | 10/2008 | Zhao et al. | |
| 7,482,686 B2 | 1/2009 | Zhao et al. | |
| 7,829,986 B2 | 11/2010 | Lee et al. | |

FOREIGN PATENT DOCUMENTS

| | | |
|---|---|---|
| JP | 7-335789 A | 12/1995 |
| JP | 8-139223 A | 5/1996 |
| JP | 2009-224560 A | 10/2009 |

OTHER PUBLICATIONS

U.S. Office Action dated Jan. 30, 2013, issued in corresponding U.S. Appl. No. 13/596,758.
US Office Action dated Mar. 15, 2013, issued in corresponding U.S. Appl. No. 13/596,736.
Japanese Office Action dated Oct. 22, 2013, issued in corresponding Japanese Patent Application No. 2010-145908 (w/partial translation).
Japanese Office Action dated Oct. 22, 2013, issued in corresponding Japanese Patent Application No. 2010-145908.
Partial machine English translation of JP8-139223.

*Primary Examiner* — Douglas Menz
(74) *Attorney, Agent, or Firm* — Westerman, Hattori, Daniels & Adrian, LLP

(57) ABSTRACT

A BGA type semiconductor device includes: a substrate having wirings and electrodes; a semiconductor element disposed on the substrate, having a rectangular plan shape, and a plurality of electrodes disposed along each side of the semiconductor element; a plurality of wires connecting the electrodes on the semiconductor element with the electrodes on the substrate; a heat dissipation member disposed on the substrate, covering the semiconductor element, and having openings formed in areas facing apex portions of the plurality of wires connected to the electrodes formed along each side of the semiconductor element; and a sealing resin member for covering and sealing the semiconductor element and heat dissipation member.

20 Claims, 7 Drawing Sheets

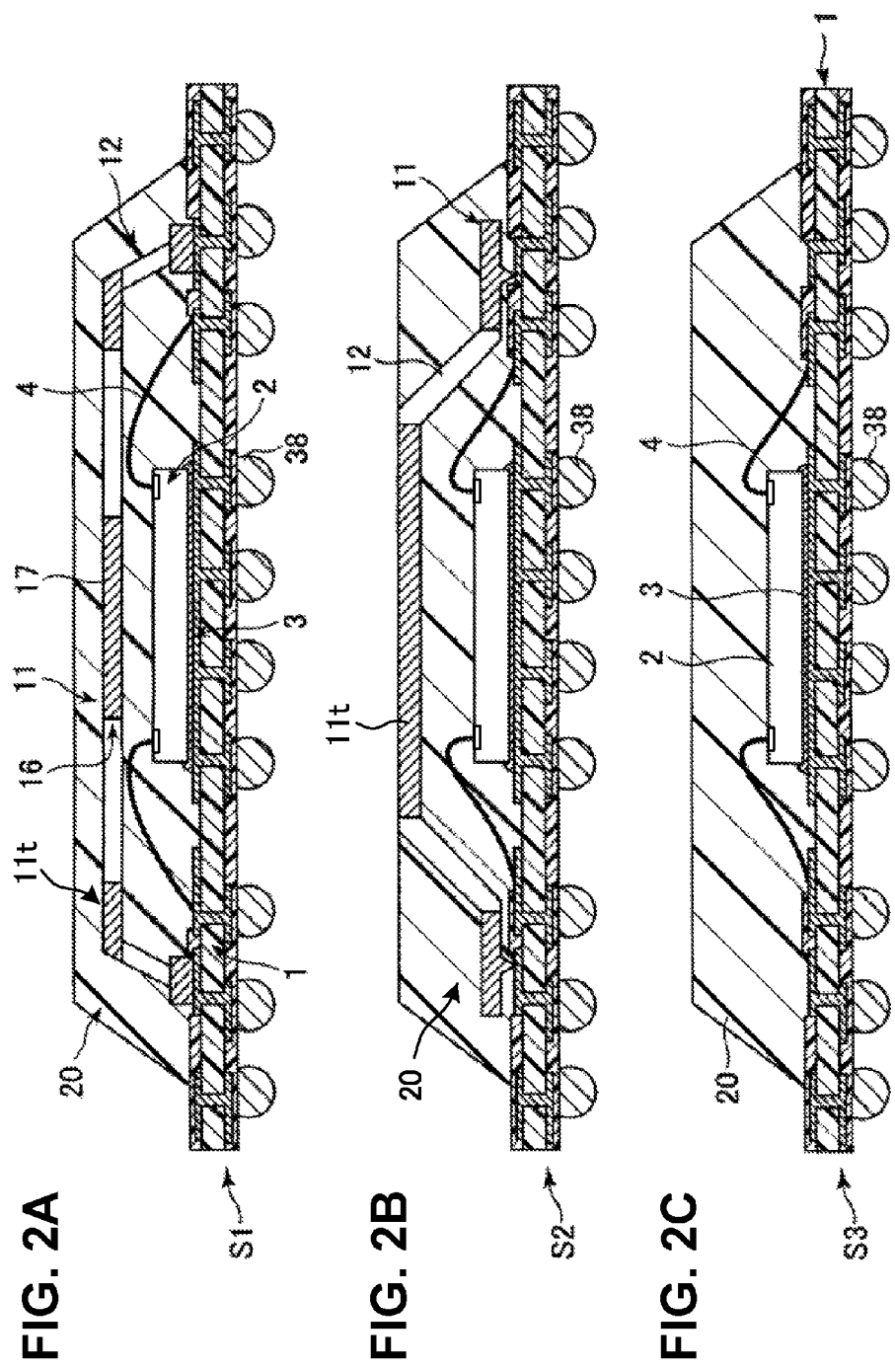

HEAT RESISTANCE ($\theta$ja)  [°C/W]

| WIND VELOCITY [m/s] | SAMPLE S1 | SAMPLE S2 | SAMPLE S3 |
|---|---|---|---|
| 0 | 13.5 | 13.0 | 14.5 |
| 1 | 11.3 | 11.0 | 12.5 |
| 3 | 9.3 | 9.0 | 10.3 |

<CONDITION>
PKG: 35mmSQ (FOUR-LAYER SUBSTRATE) / BALL: 484 / PITCH: 1.27 mm
CHIP: HEAT RESISTANCE TEG (9mmSQ)
MOUNT SUBSTRATE: FOUR-LAYER (84 × 117 × 0.8mm)

SEMICONDUCTOR DEVICE WITH HEAT SPREADER

CROSS-REFERENCE TO RELATED APPLICATION

This application is a divisional of U.S. application Ser. No. 13/023,962, filed on Feb. 9, 2011, which is based upon and claims the benefit of priority of the prior Japanese Patent Application No. 2010-145908, filed on Jun. 28, 2010, the entire contents of which are incorporated herein by reference.

FIELD

The embodiments discussed herein are related to a semiconductor device equipped with a heat spreader.

BACKGROUND

In a semiconductor device of a lead frame type such as QFP (quad flat package), the bottom face of a semiconductor element is die-bonded to a die pad of a metal lead frame, bonding pads on an upper surface of the semiconductor element are wire-bonded to the leads of the lead frame, and the semiconductor element and inner portions of the leads are molded in a plastic mold. The semiconductor element is directly mounted on the die pad of the lead frame. The die is continuous with two or four lead-like structures (called external leads), and the external leads extend to the outer surface of the plastic mold (interface between the plastic mold and the external atmosphere). Most of heat generated in the semiconductor element is dissipated via these external leads. Thus, there is less necessity of providing heat dissipating member such as a metal plate above the upper surface of the semiconductor element.

In a semiconductor device of a QFP type, leads project from side walls of the package. Therefore, as the number of leads increases, the size of a package becomes large. When the size is to be reduced, lead pitch will become narrow, posing a problem such as difficulty of mounting the package to a printed circuit board (PCB). It is difficult to manufacture a package having 500 pins or more.

There is a package of the type called ball grid array (BGA), which allows an increase in the number of leads. In the ball grid array, a semiconductor element is mounted on a substrate having electrodes and wirings, and the bonding pads of the semiconductor element are wire-bonded to the electrodes of the substrate. Solder balls are disposed on electrodes on the bottom surface of the substrate, for example in lattice pattern. Since solder balls are disposed on a flat plane in array shape, it is easy to deal with an increase in the number of pins. However, bonding pads are formed in the peripheral area of a semiconductor chip, and wire-bonded to electrodes of the substrate. There is therefore a limit in increase of the number of pins. This package structure is suitable for the number of pins from about 200 to about 1000.

The structure capable of dealing with an increased number of pins is flip-chip bonding wherein electrodes are disposed in an array shape on the upper surface of a semiconductor element, and the semiconductor element turned upside down is connected to the electrodes of the substrate via solder balls. In this case, it is difficult to provide general versatility to the substrate. It is possible for the ball grid array to use a substrate of general versatility, and the ball grid array has an intermediate structure between the lead frame and flip-chip bonding from the view point of the number of pins.

A BGA structure having resin mold body is called a plastic ball grid array (PBGA). Plastic mold of epoxy resin or the like seals the substrate surface, covers the semiconductor element and bonding wires. The substrate has a structure that electrodes and wirings are disposed on insulating member of such as glass epoxy. Since the semiconductor element will be enclosed with resin material, thermal conductivity will be low as a whole. If a heat generation amount in the semiconductor element is large, some structure is desired to positively dissipate heat generated on the surface side of a semiconductor chip.

Japanese Patent publication No. 8-139223 describes a BGA semiconductor device in which ball electrodes are disposed on the bottom surface of the substrate in a matrix shape, a semiconductor element is mounted on the front surface of the substrate, and resin body seals the semiconductor element and the bonding wires, which further includes a heat conductor (cap) buried in the sealing resin. For example, a cap made of good heat conductivity such as Cu, Cu alloy, Al, Al alloy and Fe—Ni alloy is mounted on the substrate surface on which the semiconductor element is mounted, covering the whole upper surface and side walls of the semiconductor element. A number of openings having desired shapes such as circle are formed in the upper plane and side walls of the metal cap to facilitate injection of sealing resin into a space between the cap and semiconductor element. It also discloses a structure that the cap upper plane is exposed to the resin surface, and a structure that the cap is lowered nearer to the semiconductor element in a region inside the bonding pads of the semiconductor element.

U.S. Pat. No. 7,126,218 discloses a heat spreader brought in contact with an inner area of a semiconductor element inside the areas of the bonding pads, in which the heat spreader is raised in peripheral areas and outside thereof of the semiconductor element to avoid contact with the bonding wires. It discloses a structure that the outer periphery of the heat spreader is connected to the substrate and another structure that the outer periphery of the heat spreader is floated in sealing resin body.

U.S. Pat. No. 7,432,586 describes a structure in which a semiconductor element is mounted on a stiffener, a cap is mounted on the stiffener, covering the semiconductor element, the stiffener is mounted on a substrate, and the semiconductor element is sealed in resin. The stiffener and cap are made of metal, alloy or the like having thermal conductivity and electric conductivity or ceramics, metallized plastic or the like. The stiffener and cap constitute an enclosure of the semiconductor element, dissipating heat generated by IC operation and preventing electromagnetic interference.

Thermal conductors disposed above the semiconductor elements are called cap, heat spreader, heat sink or the like. In this specification, the thermal conductor is most often called heat spreader, putting heat dissipation function as main character.

SUMMARY

An embodiment provides a semiconductor device including:

a substrate having wirings and electrodes;

a semiconductor element disposed on the substrate, having a rectangular plan shape, and a plurality of electrodes disposed along each side of the semiconductor element;

a plurality of wires connecting the electrodes on the semiconductor element with the electrodes on the substrate;

a heat dissipation member disposed on the substrate, covering the semiconductor element, and having openings formed in areas facing apex portions of the plurality of wires connected to the electrodes of the semiconductor element formed along the each side of the semiconductor element; and a sealing resin member for covering and sealing the semiconductor element and the heat dissipation member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A to 2C are schematic cross sectional views illustrating the structures of a sample S1 of the first embodiment, samples S2 and S3 of comparative examples.

DESCRIPTION OF EMBODIMENTS

The present inventors have found that in case a heat spreader such as a cap is provided covering a semiconductor element in a resin mold BGA type semiconductor device, when heat dissipation is to be improved, there arises a problem regarding resin fluidity and filling.

A need for a compact and thin semiconductor device is strong. When a heat spreader is disposed covering a semiconductor element, it has been found that small openings, as disclosed in Japanese Patent Publication No. 8-139223, are insufficient for sufficiently flowing resin into spaces in the heat spreader. For a heat spreader of a lid shape or cover type that four side plate portions surround a rectangular top plate portion, it has been found desirable to form an opening as large as possible, in each side plate portion of the four side plate portions.

If a heat spreader and a semiconductor element are provided in a resin mold member having a limited height, it has been found also that a space between the semiconductor element and heat spreader poses a problem regarding resin filling. An apparatus for molding resin injects resin from one position (mold gate) of metallic mold die. As space between the semiconductor element and heat spreader becomes narrow, cross sectional area of a resin injection path becomes narrow, and resin injection pressure should become high. As the resin injection pressure becomes high, flow (deformation) of bonding wires become large. It is desired to prevent contact between the bonding wires and the heat spreader and also avoid growing in flow of bonding wires.

Figure 1A:
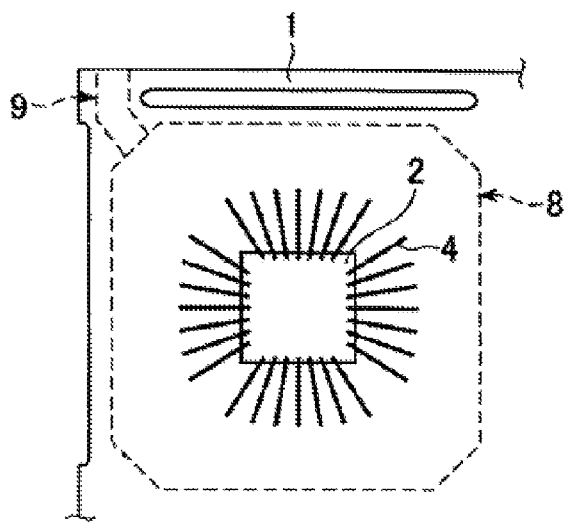
FIGS. 1A to 1C are schematic top views and a cross sectional view for explaining a semiconductor device according to a first embodiment.
Figure 1B:
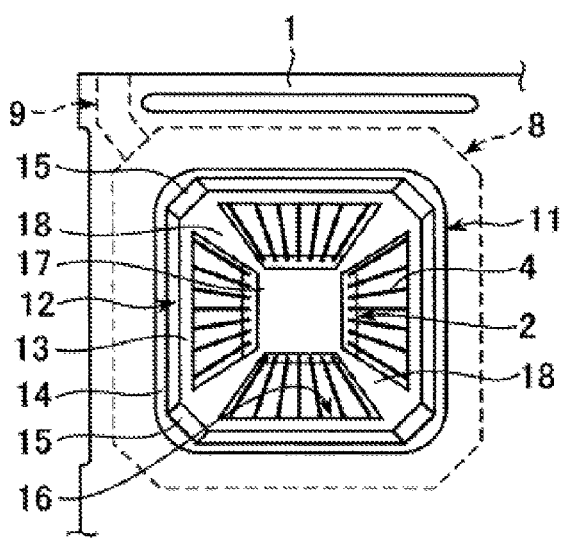
Figure 1C:
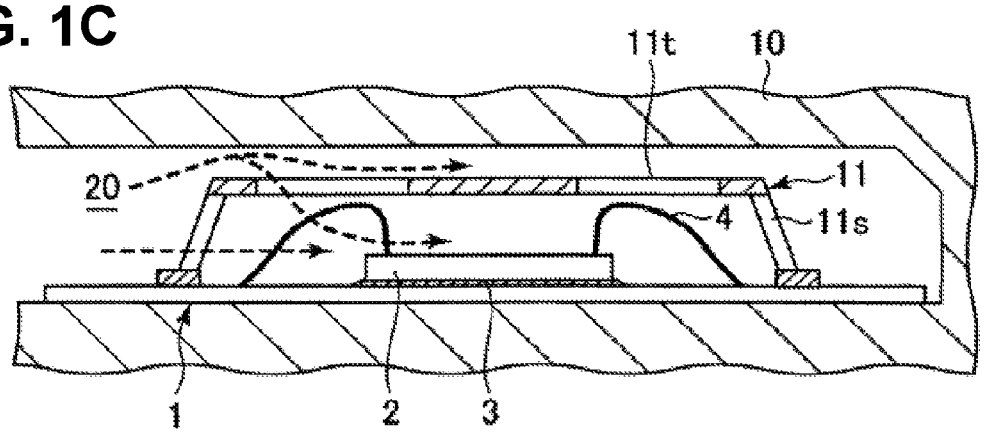

FIGS. 1A to 1C are schematic top views and a schematic cross sectional view illustrating a semiconductor device according to the first embodiment.

As illustrated in FIGS. 1A and 1C, a semiconductor element (LSI chip) 2 is die-bonded to an upper surface of a substrate 1 with metal adhesive 3 such as silver paste. The substrate 1 has a structure that two to four insulating resin layers of glass epoxy formed with copper wirings are laminated. Electrodes for wire bonding are formed on the upper surface and electrodes for connecting solder balls are formed on the bottom surface. A thickness of the substrate 1 is 0.4 mm to 0.7 mm, particularly 0.5 mm to 0.6 mm. The LSI chip 2 has a rectangle shape of, e.g., about 3 mm×3 mm to about 16 mm×16 mm. Heat generation is generally high in an upper central area. A number of bonding pads (electrodes) are formed in peripheral areas along four sides on the upper surface. Electrodes of the substrate 1 and bonding pads of the LSI chip are made of, e.g., Al or Al alloy. A bonding pad of the LSI chip 2 and a corresponding electrode of the substrate 1 are connected by a bonding wire 4 such as a gold wire. Although seven bonding wires 4 per one side are shown in FIG. 1A for the simplicity of the drawing, the number of wires (pins) is, e.g., about 50 to 250 pins per one side, and the total number of pins is about 200 to 1000 pins. The inner ends of the bonding wires 4 also represent bonding pads, and the outer ends of the bonding wires 4 also represent electrodes of the substrate. For example, bonding pads are each 44 micrometers square and are disposed at a pitch of 50 micrometers. If the number of pins is large, bonding pads may be disposed in a stagger shape. A bonding wire is, e.g., a gold wire, has a diameter of about 20 micrometers. FIG. 1A also illustrates the positions of a mold cavity 8 for resin mold and a mold gate 9 by a phantom line.

As illustrated in FIG. 1C, the bonding wires 4 extend from an LSI chip peripheral portion upwards, are bent outside in loop shape, and connected to the electrodes on the substrate 1 outside the LSI chip 2. The bonding wire 4 therefore exists also in a region above the upper surface of the LSI chip 2. A height in which the bonding wire can exist above the upper surface of the LSI chip is set, e.g., to 300 micrometers. It is necessary to dispose the heat spreader in such a manner not to allow contact with the bonding wires which rise upward from the upper surface of the LSI chip 2.

As illustrated in FIGS. 1B and 1C, the LSI chip 2 and the heat spreader 11 having a cavity for accommodating the bonding wires 4 are disposed on the substrate 1 and fixed to the substrate 1 with, e.g., non-conductive adhesive. The heat spreader 11 is formed by press work of a Cu plate having a thickness of, e.g., 0.25 mm, and its schematic shape is a lid (cap) shape having a generally rectangle top plate portion 11$t$ and four side plate portions 11$s$ continuous with the four sides of the top plate portion. The side plate portions generally constitute slanted plate portions forming a trapezoid shape. Each of the four trapezoid side plate portions 11$s$ of the heat spreader 11 is formed with a large trapezoid slit (opening) 12 in conformity with the side plate shape. Beam (or eave) regions 13 and 14 exist above and under the slit 12. The corner portion 15 between adjacent side plate portions of the heat spreader 11 and the beam regions 13 and 14 surround the slit 12.

Four trapezoid openings 16 are formed in the rectangular top plane portion 11$t$ of the heat spreader 11 along each side. The upper sides of four trapezoid openings 16 define a rectangle area 17 above the central area of the LSI chip 2 excepting the peripheral area. A Cu rectangle region 17 having a high heat conductivity is disposed above the central area of the LSI chip 2 having high calorific power (heat generation or power dissipation). Wedge shaped beam regions 18 between adjacent trapezoid openings 16 supports the rectangle region 17. The rectangle region 17 and wedge regions 18 have such a plan shape that they are excluded from the areas where raised bonding wires may exist, particularly the areas where such portions of the bonding wires which have height from the apex of the bonding wire down to at least one third the total height of the bonding wire. From a different view point, the areas where height portions of bonding wires from the apex to at least one third of the total height of the bonding wire down from the apex exist are located in the trapezoid openings 16 along each side of the LSI chip 2, as viewed in plan.

As illustrated in FIG. 1C, the substrate 1 mounting the LSI chip 2 and heat spreader 11 is loaded in the metallic mold 10 of a resin molding apparatus to perform a resin molding process. For realizing a compact and thin semiconductor device, a height of the mold resin body defined by the mold die 10 is 1.6 mm or lower, preferably 1.4 mm or lower, and more preferably 1.2 mm or lower. If a resin layer having a thickness of about 0.2 mm is retained outside the heat spreader 11, a height of the heat spreader 11 becomes 1.4 mm or lower, preferably 1.2 mm or lower, and more preferably 1.0 mm or lower. A height of a cavity in the heat spreader 11 is 1.1 mm or lower, preferably 0.9 mm or lower, and more preferably 0.7 mm or lower. Existence of the LSI chip 2 is supposed to be resistance components not negligible for resin filling. The mold resin 20 is epoxy-based resin added with filler or the like, and injected from the mold gate 9 provided at the upper left corner portion illustrated in FIGS. 1A and 1B in a melted state, e.g., at about 170° C. The injected resin 20 is separated in two directions at the corner portion of the heat spreader nearest to the mold gate 9, injected into the cavity from the slits of the adjacent side plate portions, and also flows to the outside of the heat spreader 11. The openings 16 in the rectangle top plate portion allow flow of resin into and out of the heat spreader 11.

There is a tendency that resin flows more near at the bottom of the mold cavity 8. Flow of resin detouring the outer periphery of the LSI chip 2 is likely to be retained, but defective filling is likely to be formed in the space between the upper surface of the LSI chip 2 and the bottom surface of the top plate portion 11t of the heat spreader 11. By forming the openings 16 in the heat spreader top plate portion 11t, it becomes possible that resin flows from the outside of the heat spreader 11, and it is considered that resin becomes likely to be filled in the space between the LSI chip 2 and the top plate portion of the heat spreader 11. Resin entered the cavity from the slit 12 in the side plate portion may flow out of the cavity through the opening 16 in the top plate portion. Since the heat spreader 11 has large slits and openings, resin becomes likely to flow from the outside of the heat spreader 11 to the inside of the heat spreader or vice versa. The rectangle region 17 of the top plate portion is held in the central area excepting the bonding pad area of the LSI chip, and a large opening 16 is formed along four sides. A plan size of a space between the LSI chip 2 and rectangle region 17 becomes small so that it is expected that resistance against the resin flow in this space becomes small. As the slits and openings have the trapezoid shape as described above, it is expected that the width of the opening where resin reaches first may be made wide and the resistance against a resin flow may be made small.

Resin is filled in the whole space in the mold die including the cavity surrounded by the heat spreader 11, then melted resin is cooled and solidified, and the semiconductor device is taken out from the mold die. By smoothing a flow of melted resin, it is expected to obtain a resin mold (P) BGA type semiconductor device with suppressed voids and regions not filled with resin. The semiconductor device of the first embodiment is formed in this manner. The slit of the side plate portion 11s and the opening 16 of the top plate portion 11t are not limited to a trapezoid shape. A rectangular shape, a rectangular stack may also be used.

A sample S1 of the embodiment and samples S2 and S3 of the comparative examples were manufactured in order to evaluate the heat characteristics of the semiconductor device of the first embodiment.

FIG. 2A is a schematic cross sectional view illustrating the structure of the sample S1 of the embodiment. A substrate 1 is a four-layer substrate of 35 mm square. 484 solder balls 38 connected with the surface electrodes are disposed on the bottom surface at a pitch of 1.27 mm. A heat spreader 11 is made of a CU plate having a thickness of about 0.25 mm. A plan size of the heat spreader 11 was set to 28 mm×28 mm in correspondence with the 35 mm square package. This size is suitable for a semiconductor chip of 8 mm square to 10 mm square. A height of the sealing resin body 20 is set to about 1.1 mm, and a total height of the heat spreader 11 is set to about 0.9 mm. A height of the slit 12 of the side plate portion is set to about 0.3 mm. The rectangle region 17 in the central area of the top plate portion 11t of the heat spreader 11 is set to about 6 mm square, the trapezoid opening 16 outside the four sides of the rectangle region 17 has a bottom side of about 13 mm, an upper side of about 4 mm, and a height of about 5 mm. An area of the central rectangle region 17 is about 36 mm$^2$, an area of the opening 16 outside each side is about 42 mm$^2$. The opening 16 having an area larger than the rectangle region 17 is disposed outside the four sides of the rectangle region 17.

The semiconductor chip 2 is made of a chip of a heat resistance test element group having an area of 9 mm square. As stated above, a total height of the heat spreader is about 0.9 mm, and a thickness of the heat spreader is about 0.25 mm. When the thickness of the semiconductor chip is about 300 micrometers (0.3 mm), a space between the upper surface of the semiconductor chip 2 and the bottom surface of the top plate portion 11t of the heat spreader 11 (0.9−0.25−0.3 mm=0.35 mm) becomes almost comparable to a height of the semiconductor chip (0.3 mm). A height of a flow path is reduced to about one half on the semiconductor chip. Since there is fear that resin becomes hard to flow above the semiconductor chip, a thickness of the semiconductor chip is reduced to 200 micrometers. An upper space having a height (about 450 micrometers) larger than a thickness of the semiconductor chip is retained above the LSI chip 2 having a height of about 200 micrometers. A height of the upper space of two times the height of the LSI chip or more would be preferable from the viewpoint of resin fluidity. More preferable resin flow would be expected. The substrate 1 is further connected to a printed circuit board (mount substrate) having a size of 84 mm×117 mm×0.8 mm.

FIG. 2B is a schematic cross sectional view of the sample S2 of the comparative example. As compared to the sample S1 illustrated in FIG. 2A, the heat spreader 11 is exposed on the surface of resin 20. There is no opening in the top plate portion of the heat spreader 11. Since the same mold die was used, a height of the resin body 20 has the same height of 1.1 mm. In this structure, the top plate portion 11t of the heat spreader 11 contacts the ceiling portion of the mold die. If the top plate portion of the heat spreader 11 does not tightly contact the ceiling portion of the mold die, a space is formed therebetween and resin enters the space to form resin burr. If resin burr is to be avoided, work of forming the heat spreader requires high precision, high cost and increased labor.

FIG. 2C is a schematic cross sectional view illustrating the structure of the ample S3 not using the heat spreader 11 and corresponding to the structure illustrated in FIG. 2A without the heat spreader 11. Height of the resin 20 is the same as about 1.1 mm.

Figures 2D, 2E:
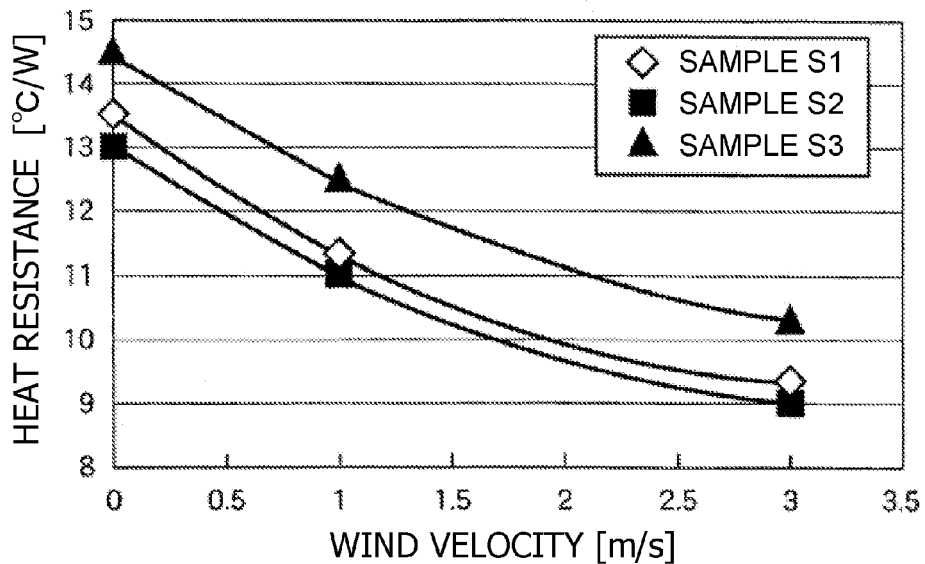
FIGS. 2D and 2E are a table and a graph illustrating heat resistance data obtained by measuring the characteristics of the samples.

FIGS. 2D and 2E are a table and a graph illustrating the results of measuring heat resistance relative to a wind velocity around the semiconductor device. A wind velocity was changed at 0 m/s, 1 m/s, and 3 m/s. Heat resistance is represented in the unit of ° C./W in FIG. 2D. In FIG. 2E, the abscissa represents wind velocity (m/s), and the ordinate represents heat resistance (° C./W). Tendency that as a wind velocity increases, heat resistance lowers appears in common to the samples S1, S2 and S3. The sample S3 has the highest heat resistance, and the samples S1 and S2 with the heat spreader definitely lower the heat resistance. Heat resistance of the sample S1 having openings in the top plate portion of the heat spreader is higher than that of the sample S2 having a top plate portion without an opening exposed at the upper surface of the resin 20, but a difference is small. As compared to the sample S3, it is possible to say that the sample S1 realizes the heat resistance almost equal to that of the sample S2. It has been confirmed that in the sample S1 having the openings in the top plate portion 2, resist fluidity (filling) in the space between the heat spreader and semiconductor chip is good, and that voids are hard to be formed.

In the sample S2, the top plate portion of the heat spreader is exposed and heat dissipation into the atmospheric air on the package surface side is good. However, heat generated in the semiconductor chip reaches the heat spreader through a thicker mold resin, and hence heat conduction is not very good. In the sample S1, the heat spreader is buried in the mold resin, and a distance between the top plate rectangle region and semiconductor chip is short. Heat generated in the semiconductor chip may propagate to the heat spreader more speedily, and transfer the heat through the wedge regions 18, corner portions 15, etc. of the heat spreader, to the package substrate and mount substrate. The sample S1 has openings in the top plate portion and an area for absorbing heat is small. It is considered that high heat dissipation is retained in sample S1 at least partly because the distance from the semiconductor chip to the heat spreader is short.

Provision of large openings formed in the top plate portion of the heat spreader improves resin fluidity and resin filling, while suppressing increase in heat resistance.

Figure 3A:
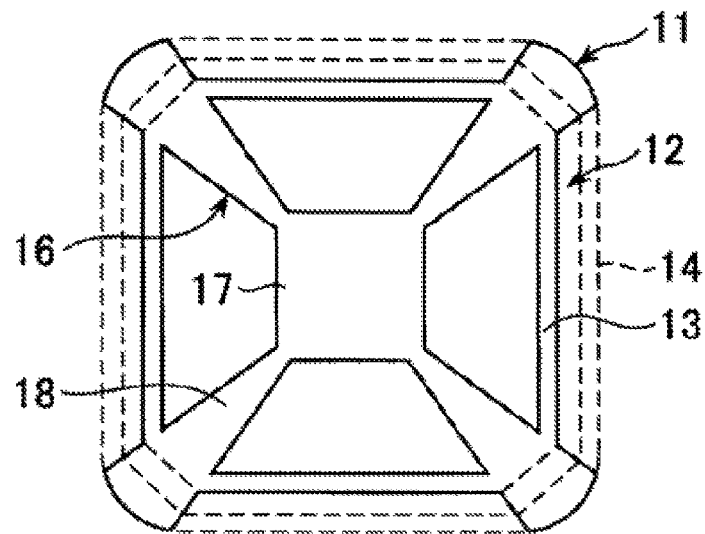
FIGS. 3A and 3B are schematic plan views illustrating two modifications of the first embodiment.
Figure 3B:
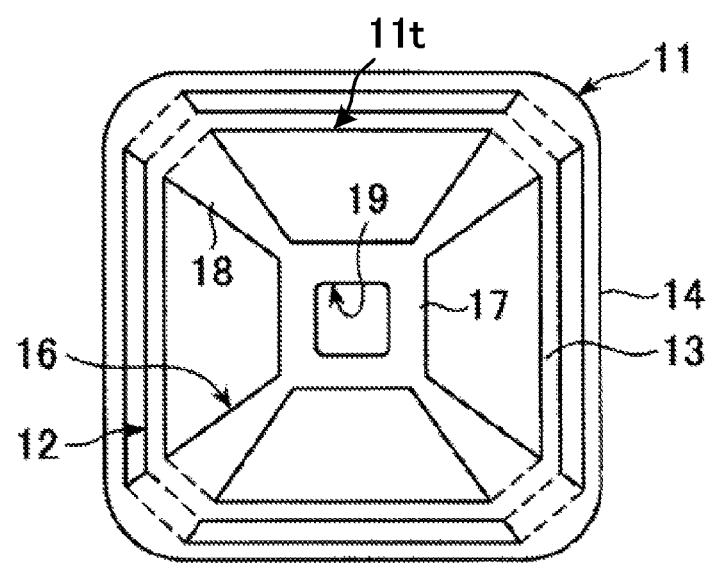
Figure 3C:
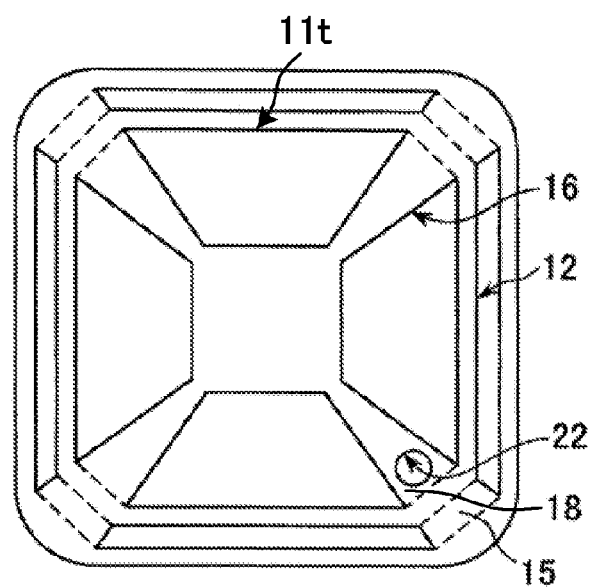
FIGS. 3C and 3D are a schematic plan view and a schematic cross sectional view illustrating a further modification of the first embodiment.

FIGS. 3A, 3B and 3C are plan views illustrating modifications of the heat spreader of the first embodiment. FIG. 3A illustrates a configuration in which the lower beam region 14 of the side plate portion of the heat spreader 11 is removed. Resin flows swiftly near at the bottom surface of the cavity established in the mold die. It is expected that resin fluidity is improved if the beam region 14 near the bottom does not exist.

FIG. 3B illustrates a configuration in which an opening 19 is formed further in the rectangular region 17 of the top plate portion of the heat spreader. It is expected that resin is more easily filled in the space between the bottom surface of the top plate portion of the heat spreader 11 and the upper surface of the LSI chip 2 by the provision of the opening 19.

FIG. 3C illustrates a configuration in which an opening 22 is formed also in the wedge region 18 of the top plate portion 11t. Resin is injected from the mold gate 9 illustrated in FIGS. 1A and 1B, and flows from the corner of the heat spreader having a rectangle plan shape in two directions and enters the heat spreader, as viewed roughly.

Figure 3D:
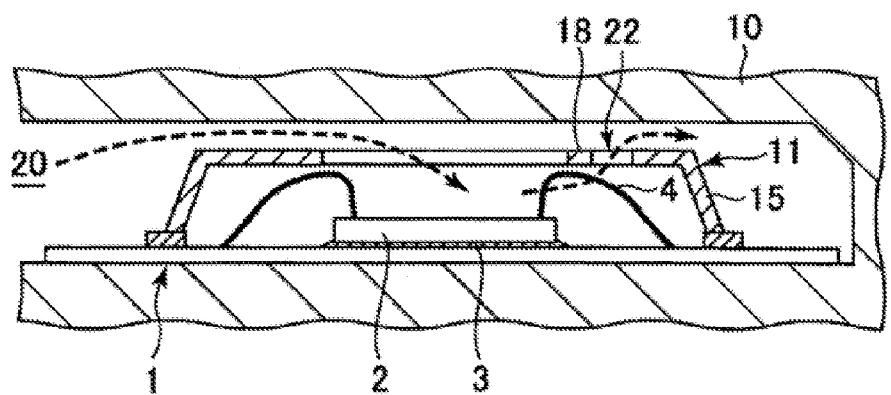

As illustrated in FIG. 3D, at the opposing corner of the mold gate, the corner portion 15 and wedge region 18 may work as a stopper against the last flow of resin. If air bubbles, voids and the like enter together with resin, and there is no escape path of the resin, regions not filled with resin and pin holes are likely to be formed in the diagonal end region facing the mold gate. An opening 22 is formed in the wedge region 18 on the side of resin outflow to allow the resin to flow from the inside of the heat spreader 11 to the outside. It is expected to improve resin filling by forming a resin flow even at the final region in the heat spreader.

Figure 4A:
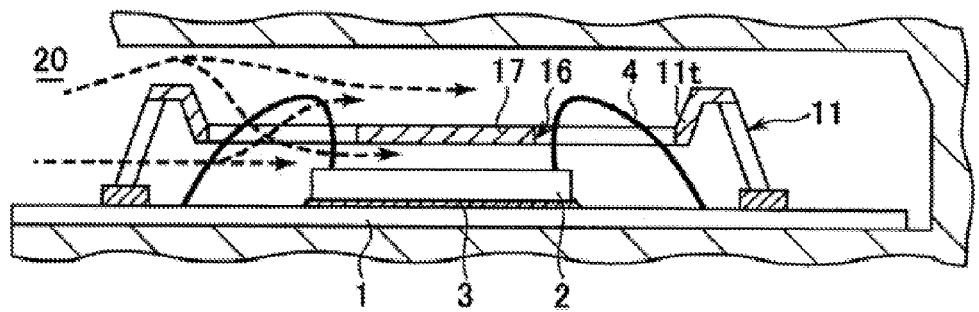
FIGS. 4A, 4B and 4C are cross sectional views illustrating a second embodiment and its modification.
Figure 4B:
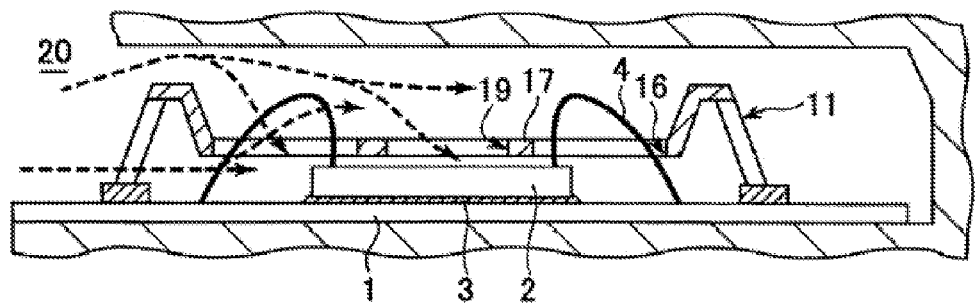
Figure 4C:
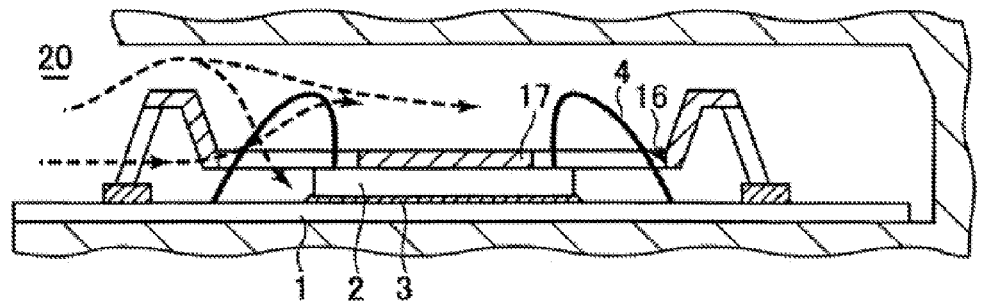

FIGS. 4A, 4B and 4C are cross sectional views illustrating a semiconductor device of the second embodiment and its modifications. In the second embodiment, the top plate portion 11t of the heat spreader 11 does not have a flat plate shape, but has a central area lowered toward the semiconductor chip.

As illustrated in FIG. 4A, the top plate portion 11t of the heat spreader 11 is lowered from the outer periphery via a slanted plane, and the area inside the slanted plane constitutes a flat plane portion. Openings 16 and a rectangle region 17 similar to those of the first embodiment are formed in the flat plane portion. The bonding wires 4 have a shape raised upward higher than the top plate portion 11t of the heat spreader 11 in the opening 16.

FIG. 4B illustrates a configuration in which similar to the configuration illustrated in FIG. 4A the top plate portion 11t of the heat spreader 11 is lowered in the inner area, and a rectangle opening 19 is formed in the central rectangle area 17. Even if the space between the top plate portion 11t of the heat spreader 11 and the upper surface of the semiconductor chip 2 is narrow, it is expected to retain resin filling by providing opening above the space.

FIG. 4C illustrates a configuration in which similar to the configuration of FIG. 4A, the top plate portion 11t of the heat spreader 11 is lowed, and in this case by an increased amount in an inner area to make the inner rectangle area 17 contact the upper surface of the semiconductor chip 2. Heat conductivity is expected to be improved.

FIGS. 5A to 5H are schematic cross sectional views illustrating the manufacture processes for the semiconductor device of the embodiment.

Figure 5A:
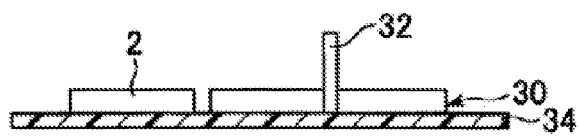
FIGS. 5A to 5H are schematic cross sectional views illustrating processes for manufacturing a semiconductor device according to an embodiment.

As illustrated in FIG. 5A, a semiconductor chip 2 is cut from a semiconductor wafer by using a dicer 32. The semiconductor wafer 30 is bonded to a UV tape 34, and the UV tape 34 is not cut and separated. The semiconductor chip 2 is able to be picked up by radiating ultra violet (UV) rays to the UV tape 34.

Figure 5B:
Figure 5C:
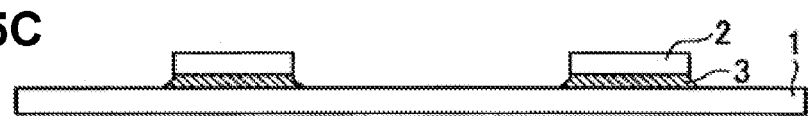

As illustrated in FIG. 5B, silver paste 3 for die bonding is coated on a substrate 1. As illustrated in FIG. 5C, the semiconductor chip 2 is placed on the silver paste 3. The silver paste is heated to be thermally cured or hardened to die-bond the semiconductor chip 2 with the conductive adhesive 3.

Figure 5D:
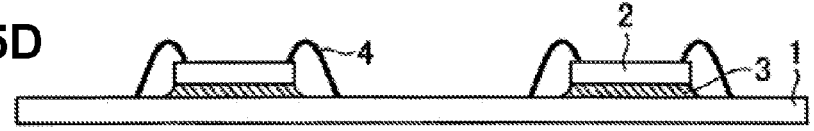
Figure 5E:
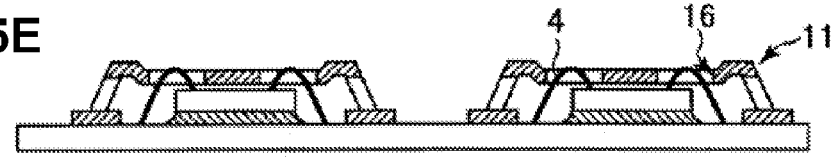

As illustrated in FIG. 5D, electrodes on the semiconductor chip 2 are wire bonded to counterpart electrodes on the substrate 1 by gold wires 4. As illustrated in FIG. 5E, a heat spreader 11 is positioned above each semiconductor chip 2 and fixed to the substrate 1 with non-conductive adhesive. The top plate portion of the heat spreader 11 has openings. A one/third portion of the whole height of the gold wire from the apex is disposed in any of the openings with a sufficient margin.

Figure 5F:
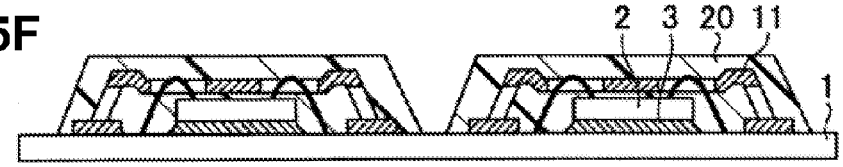

As illustrated in FIG. 5F, the substrate is placed in the mold die of a resin mold apparatus to perform a mold process and form a resin seal body 20. The opening formed in the heat spreader retains resin fluidity and resin filling. The main portion of the semiconductor device is completed in this manner.

Figure 5G:
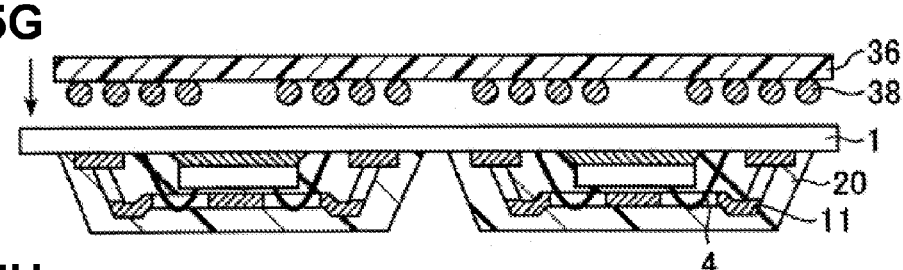

As illustrated in FIG. 5G, the semiconductor device is turned upside down, and solder balls 38 sucked to a sucking jig are lowered and disposed on the electrodes on the bottom surface of the substrate 1. After the solder balls 38 are mounted on the electrodes of the substrate 1, the jig 36 is removed.

Figure 5H:
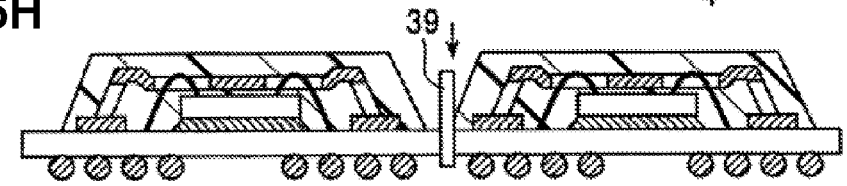

As illustrated in FIG. 5H, the substrate is cut and separated by a dicer to form individual semiconductor devices.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What we claim are:

1. A semiconductor device comprising:
    a substrate having wirings and first electrodes;
    a semiconductor element disposed above said substrate, having a rectangular plan shape, and a plurality of second electrodes disposed along each side of said semiconductor element;
    a plurality of wires connecting the second electrodes above said semiconductor element with the first electrodes above said substrate;
    a heat spreader disposed above said substrate, covering said semiconductor element, and having a central plate portion and a plurality of side plate portions surrounding said central plate portion, the central plate portion having openings formed in areas facing apex portions of the plurality of wires connected to the second electrodes of the semiconductor element; and
    a sealing resin member covering and sealing said semiconductor element and said heat spreader.

2. The semiconductor device according to claim 1, wherein said heat spreader has a lid shape including the central plate portion having a plan shape of a rectangle defined by four sides and facing a surface of said semiconductor element, and the plurality of side plate portions formed of four side plate portions formed along four sides of said central plate portion.

3. The semiconductor device according to claim 2, wherein:
    said openings formed in areas facing apex portions of said wires include four first openings of a trapezoid shape formed in said central plate portion along the four sides of said central plate portion, and said four first openings surround a rectangle central region; and
    each of said side plate portions has a second opening of a trapezoid shape having a longer bottom side than an upper side.

4. The semiconductor device according to claim 3, wherein said four first openings of the trapezoid shape each have an area larger than an area of said rectangle central region.

5. The semiconductor device according to claim 3, wherein said central plate portion has another opening of rectangle shape in said rectangle central region.

6. The semiconductor device according to claim 3, wherein a height between a bottom surface of said central plate portion and an upper surface of said semiconductor element is higher than a height of said semiconductor element.

7. The semiconductor device according to claim 3, wherein said heat spreader includes bent portions between said side plate portions and said central plate portion, said bent portions lowering from a side of said side plate portions toward said central plate portion.

8. The semiconductor device according to claim 7, wherein said wires have portions rising higher than said central plate portion.

9. The semiconductor device according to claim 3, wherein said central plate portion includes four beam regions disposed between each adjacent pair of said four first openings, and connecting said rectangle central region and said side plate portions, and includes an opening formed in one of said beam regions near at said side plate portion.

10. The semiconductor device according to claim 3, wherein each of said second openings of the trapezoid shape has open bottom side.

11. The semiconductor device according to claim 4, wherein said substrate is a glass epoxy substrate having copper wirings.

12. The semiconductor device according to claim 11, wherein said heat spreader is fixed to said substrate with non-conductive adhesive.

13. The semiconductor device according to claim 11, wherein said semiconductor element is a silicon LSI chip and is die-bonded to said substrate with metal adhesive.

14. The semiconductor device according to claim 13, wherein said wires are gold wires, and said sealing resin is epoxy resin added with filler.

15. The semiconductor device according to claim 14, wherein electrodes of said substrate and said semiconductor element are made of Al or Al alloy.

16. The semiconductor device according to claim 4, wherein the number of the second electrodes of said semiconductor element is in a range of 200 to 1000.

17. The semiconductor device according to claim 4, wherein a thickness of said sealing resin on said heat spreader is thicker than or equal to 0.2 mm or thicker.

18. The semiconductor device according to claim 4, wherein a height of said sealing resin is lower than or equal to 1.6 mm.

19. The semiconductor device according to claim 18, wherein a height of said heat spreader is lower than or equal to 1.4 mm.

20. The semiconductor device according to claim 4, further comprising a plurality of solder balls disposed above a bottom surface of said substrate and connected to the second electrodes on said semiconductor element.

* * * * *